United States Patent [19]
Hayakawa

[11] Patent Number: 6,167,071
[45] Date of Patent: Dec. 26, 2000

[54] SEMICONDUCTOR LASER

[75] Inventor: Toshiro Hayakawa, Kanagawa-ken, Japan

[73] Assignee: Fuji Photo Film Co., Ltd., Kanagawa-Ken, Japan

[21] Appl. No.: 09/156,596

[22] Filed: Sep. 18, 1998

[30] Foreign Application Priority Data

Sep. 25, 1997 [JP] Japan ................................. 9-259739

[51] Int. Cl.⁷ ....................................................... H01S 5/00
[52] U.S. Cl. ........................................................... 372/45
[58] Field of Search .................................. 372/45, 46, 96

[56] References Cited

U.S. PATENT DOCUMENTS

| | | | |
|---|---|---|---|
| 5,255,278 | 10/1993 | Yamanaka | 372/45 |
| 5,448,584 | 9/1995 | Ueno | 372/45 |
| 5,568,504 | 10/1996 | Kock et al. | 372/96 |
| 5,727,013 | 3/1998 | Botez et al. | 372/96 |

FOREIGN PATENT DOCUMENTS 63-287080  11/1988  Japan .

OTHER PUBLICATIONS

"The Blue Laser Diode: GaN Based Light Emitters and Lasers", Nakamura et al., Nichia Chemical Industries Ltd., Springer–Verlag Berlin Heidelberg 1997, Chap. 13 & 14. (No Month Available).

*Primary Examiner*—Teresa M. Arroyo
*Assistant Examiner*—Quyen P. Leung
*Attorney, Agent, or Firm*—Sughrue, Mion, Zinn, Macpeak & Seas, PLLC

[57] ABSTRACT

An end face emitting type semiconductor laser has a first semiconductor layer including a first clad layer, an active layer and a second semiconductor layer including a second clad layer superposed one on another in this order on a substrate. A first electrode is formed on the substrate or the first semiconductor layer and a second electrode is formed on the upper surface of the second semiconductor layer. The second semiconductor layer is transparent to light of a wavelength at which the semiconductor laser oscillates, and a pattern of concavity and convexity is formed on the upper surface of the second semiconductor layer in a region corresponding to an oscillating part of the semiconductor laser.

9 Claims, 7 Drawing Sheets

WAVELENGTH (nm)

SEMICONDUCTOR LASER

BACKGROUND OF THE INVENTION

1. Field of the Invention

This invention relates to a semiconductor laser, and more particularly to a semiconductor laser in which a substrate and/or a semiconductor layer is transparent to the oscillation wavelength.

2. Description of the Related Art

Recently semiconductor lasers have come to be widely used in light communication, optical discs, laser printers and the like. Advent of high output semiconductor lasers not lower than 1W has realized application of semiconductor lasers to sublimation of dye by use of a laser spot as a high density heat source or to image forming, processing of material or soldering by use of laser abrasion.

At present, there has been employed a 0.98 μm-band semiconductor laser having an InGaAs strained quantum-well as a pumping light source or a heat source for a fiber amplifier in light communication. Further an InGaAs strained quantum-well semiconductor laser having an oscillation wavelength in the range of 0.9 to 1.1 μm is important as a light source for generating a second harmonic laser beam of blue or green. However it has been found that it is difficult for the oscillation spectrum to be of a single mode in the conventional InGaAs strained quantum-well semiconductor lasers. This is because the gain spectrum is modulated by a multiple resonator effect based on interference by reflected light from n- or p-side, mainly from the electrode surface.

Similarly in a short wavelength semiconductor laser which has an InGaN active layer and is expected as a light source for a high-density optical disc, periodic modulation in the gain spectrum also appears. See "The Blue Laser Diode, GaN Based Light Emitters and Lasers", Springer, Berlin 1997, Chap. 13, 14. This is also because the gain spectrum is modulated by a multiple resonator effect based on interference by reflected light from n- or p-side, mainly from the electrode surface. Though the semiconductor lasers of such material are now under development and accordingly their characteristics are not clear in detail, they are unstable in the oscillation spectrum and can generate noise due to multiple mode oscillation and mode hop when used as a light source for optical discs or very fine printers.

Accordingly there has been a demand for suppressing the multiple resonator effect in the semiconductor laser of the type described above so that the semiconductor laser can stably oscillate in a single line spectrum.

Generally a semiconductor laser in a short wavelength range is formed by superposing a semiconductor layer on a substrate and/or a buffer layer which acts as an absorption medium on oscillating light. Further a cap layer on which an ohmic electrode is formed often acts as an absorption medium on oscillating light. Such a semiconductor laser includes, for instance, an AlGaAs laser having a GaAs substrate and an InGaAlP laser and in such semiconductor lasers, a relatively stable oscillation in a single line spectrum can be obtained when transverse mode control is carried out by an optical waveguide structure. On the other hand, in an InGaAs quantum-well semiconductor laser having a GaAs substrate, oscillation spectrum has a plurality of peaks. This condition is shown in FIGS. 10A and 10B. FIGS. 10A and 10B show the characteristics of an InGaAs quantum-well semiconductor laser having a GaAs substrate which is for pumping a fiber amplifier and oscillates near 975 nm. FIG. 10A shows the emission spectrum in a state below the threshold condition and FIG. 10B shows the emission spectrum in a lasing state. As shown in FIG. 10A, an emission spectrum modulated at a period longer than Fabry-Perot modes appears from a state below the threshold condition, and the oscillation spectrum is in a multiple mode reflecting the periodically modulated gain spectrum as shown in FIG. 10B. Though this semiconductor laser can oscillate in a single longitudinal mode in a limited light output range and a limited temperature range, the longitudinal mode varies with change in the light output and the temperature and noise is generated. Further though the oscillation wavelength can be stabilized by use of a grating, a band pass filter, a fiber grating or the like, it is difficult to stably lock the wavelength due to its long periodic structure, and the oscillation wavelength sometimes hops over the adjacent mode to a mode spaced from the original mode by several modes according to modulation at a long period. Thus it is very difficult to stabilize the oscillation wavelength.

In an InGaAs quantum-well semiconductor laser, a substrate, a buffer layer for a high quality crystal growth and a cap layer on which an ohmic electrode is formed are generally formed of GaAs. Since the forbidden band of the GaAs is transparent to the oscillation wavelength of the InGaAs, a part of the oscillating light is reflected at the surface of the substrate and/or the surface of the electrode in contact with the cap layer and the spectrum is modulated by multiple interference.

The influence of the interference is more significant in a multiple transverse mode laser where the stripe width is large. We have found that there is a large difference in spectrum between the case where the substrate and the like are transparent to the oscillation wavelength and the case where the substrate and the like are untransparent to the oscillation wavelength also in a gain optical waveguide type multiple transverse mode laser having an oxide film stripe 50 μm wide. That is, we have found that in a semiconductor laser which oscillates near 800 nm to which the GaAs substrate is untransparent, the oscillation spectrum has a single peak as shown in FIG. 11 while in a semiconductor laser which oscillates near 1070 nm to which the GaAs substrate is transparent, the oscillation spectrum has a plurality of peaks as shown in FIG. 12. Further we made an InGaAs active layer semiconductor laser having a GaAs substrate and confirmed that in 0.94 to 1.07 μm band lasers, the oscillation spectrum could not have a single peak. When such a multiple peak oscillation spectrum is employed to pump fiber amplifiers or solid state lasers, there arise problems that pumping efficiency deteriorates due to a large width of spectrum relative to the absorption band of the medium to be pumped and partition noise is generated due to switching between different wavelengths. Further when such a multiple peak oscillation spectrum is employed as a heat source for image forming, for instance, in a printer, image quality is deteriorated due to fluctuation in intensity.

Similarly in a short wavelength semiconductor laser having an active layer of InGaN, a GaN or AlGaN layer as a buffer layer and a GaN layer as a cap layer are transparent to the oscillation wavelength and a sapphire or spinel as a substrate is transparent to the oscillation wavelength. Accordingly the spectrum of the semiconductor laser is modulated by the multiple resonator effect. In a commercially available InGaN blue LED, the emission spectrum is also modulated by the similar interference effect. This was confirmed by observing the emission spectrum from the LED tip end face with the resin on the end face removed. Thus it has been found that when the material of the substrate and the like is transparent, the emission spectrum is greatly affected by interference. Since a LED is not an oscillator, the effect does not lead to instability in a LED. However in the case of a semiconductor laser, the effect makes the oscillation mode instable and leads to increase in noise.

SUMMARY OF THE INVENTION

In view of the foregoing observations and description, the primary object of the present invention is to provide a semiconductor laser the substrate and the like of which is transparent to the oscillation wavelength and in which the multiple resonator effect is suppressed so that the semiconductor laser can stably oscillate in a single line spectrum.

In accordance with a first aspect of the present invention, there is provided an end face emitting type semiconductor laser comprising a first semiconductor layer including a first clad layer, an active layer and a second semiconductor layer including a second clad layer superposed one on another in this order on a substrate, a first electrode being formed on the substrate or the first semiconductor layer and a second electrode being formed on the upper surface of the second semiconductor layer, wherein the improvement comprises that the second semiconductor layer is transparent to light of a wavelength at which the semiconductor laser oscillates, and a pattern of concavity and convexity is formed on the upper surface of the second semiconductor layer in a region corresponding to an oscillating part of the semiconductor laser.

In accordance with a second aspect of the present invention, there is provided an end face emitting type semiconductor laser comprising a first semiconductor layer including a first clad layer, an active layer and a second semiconductor layer including a second clad layer superposed one on another in this order on a substrate, a first electrode being formed on the lower surface of the substrate and a second electrode being formed on the upper surface of the second semiconductor layer, wherein the improvement comprises that the first semiconductor layer and the substrate are transparent to light of a wavelength at which the semiconductor laser oscillates, and a pattern of concavity and convexity is formed on the lower surface of the substrate in a region corresponding to an oscillating part of the semiconductor laser.

In accordance with a third aspect of the present invention, there is provided an end face emitting type semiconductor laser comprising a first semiconductor layer including a first clad layer, an active layer and a second semiconductor layer including a second clad layer superposed one on another in this order on a substrate, a first electrode being formed on the lower surface of the substrate and a second electrode being formed on the upper surface of the second semiconductor layer, wherein the improvement comprises that the first semiconductor layer, the substrate and the second semiconductor layer are transparent to light of a wavelength at which the semiconductor laser oscillates, and a pattern of concavity and convexity is formed on at least one of the upper surface of the second semiconductor layer and the lower surface of the substrate in a region corresponding to an oscillating part of the semiconductor laser.

The substrate may be, for instance, of GaAs and the active layer may be, for instance, of InGaAs or InGaN.

The first and second clad layers should have different types of conductivity. For example, when the first clad layer is of p-type, the second clad layer should be of n-type and vice versa.

Each of the first and second semiconductor layers may only comprise a clad layer or may comprise a clad layer and one or more other semiconductor layers.

Said "oscillating part" is a part of the semiconductor laser actually contributing to laser oscillation. For example, in the case of a stripe type semiconductor laser, the part of the active layer into which an electric current is injected is the oscillating part. Further "a region corresponding to an oscillating part of the semiconductor laser" is a part which transmits (if the pattern of concavity and convexity is not formed thereon) light from the oscillating part and reflected light from the surface of the electrode, which results in multiple interference.

Further the pattern of concavity and convexity is intentionally formed on the surface so that the light reflected at the surface of the electrode is prevented from returning to the oscillating part and causing interference, and may be of any shape. For example, the pattern of concavity and convexity may comprise grooves in a stripe pattern, islands, holes or the like. Further the pattern of concavity and convexity may be formed either over the entire area of the "region corresponding to the oscillating part of the semiconductor laser" or only a part thereof.

In accordance with the present invention, since a pattern of concavity and convexity is formed on a semiconductor layer or a substrate in contact with a surface of an electrode which reflects light from the oscillating part, interference of light is prevented and modulation of the spectrum at a long period by a multiple resonator effect other than Fabry-Perot modes can be suppressed. As a result, in a semiconductor laser in which transverse mode control is carried out, it becomes easy to realize oscillation in a single line spectrum. Further since switching between discrete longitudinal modes generated by the multiple resonator effect can be suppressed, whereby noise can be reduced. Further when wavelength locking is carried out by return light from an external optical system including a wavelength selector such as a grating, a single peak gain spectrum can be obtained, whereby stable locking can be realized.

DESCRIPTION OF THE PREFERRED EMBODIMENTS

Figure 1:
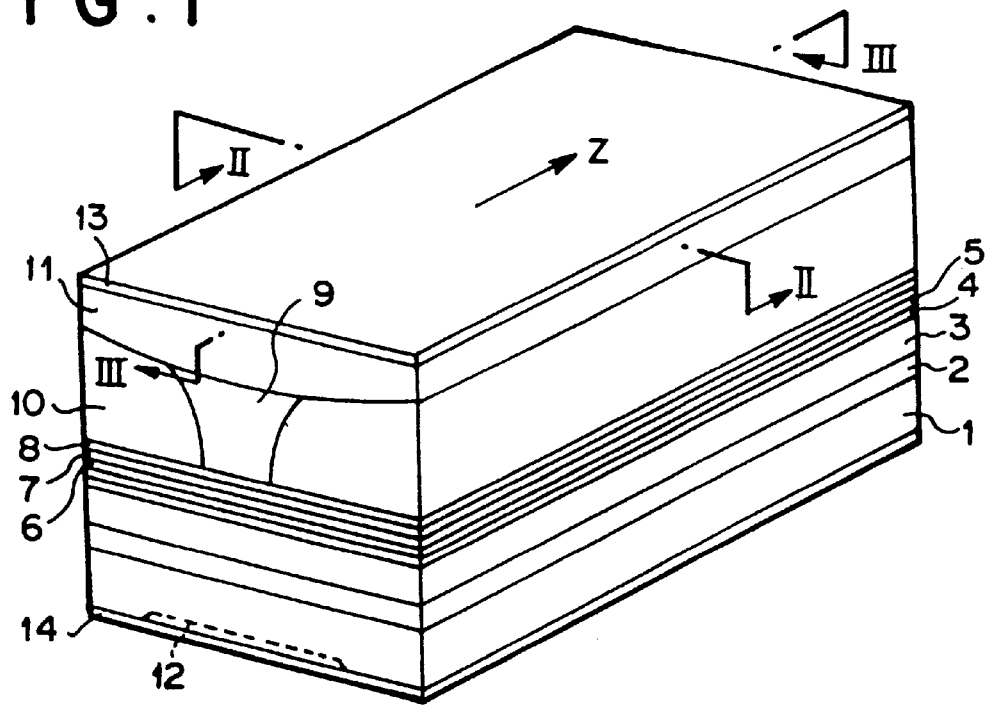
FIG. 1 is a perspective view of a semiconductor laser having an InGaAs active layer in accordance with a first embodiment of the present invention.
Figure 2:
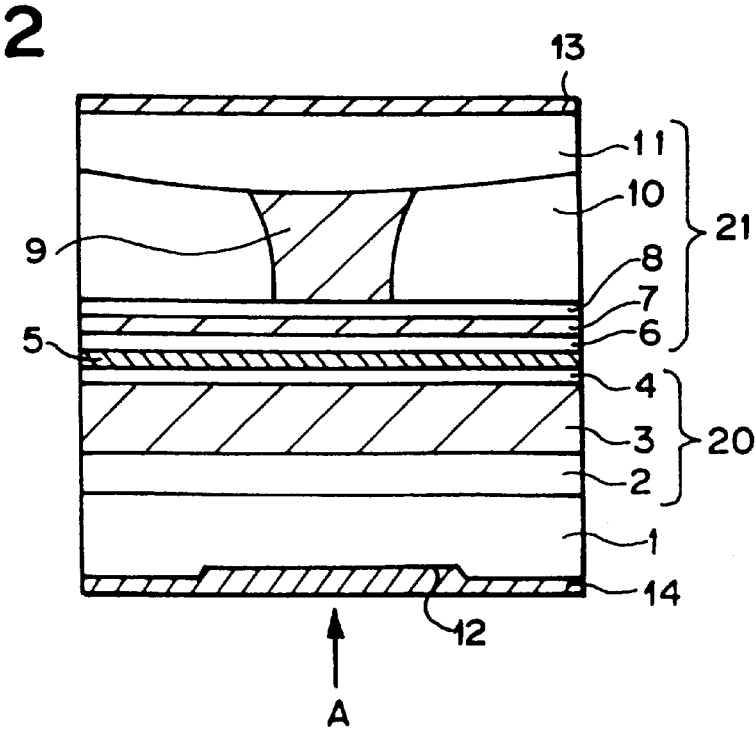
FIG. 2 is a cross-sectional view taken along line II—II in FIG. 1.
Figure 3:
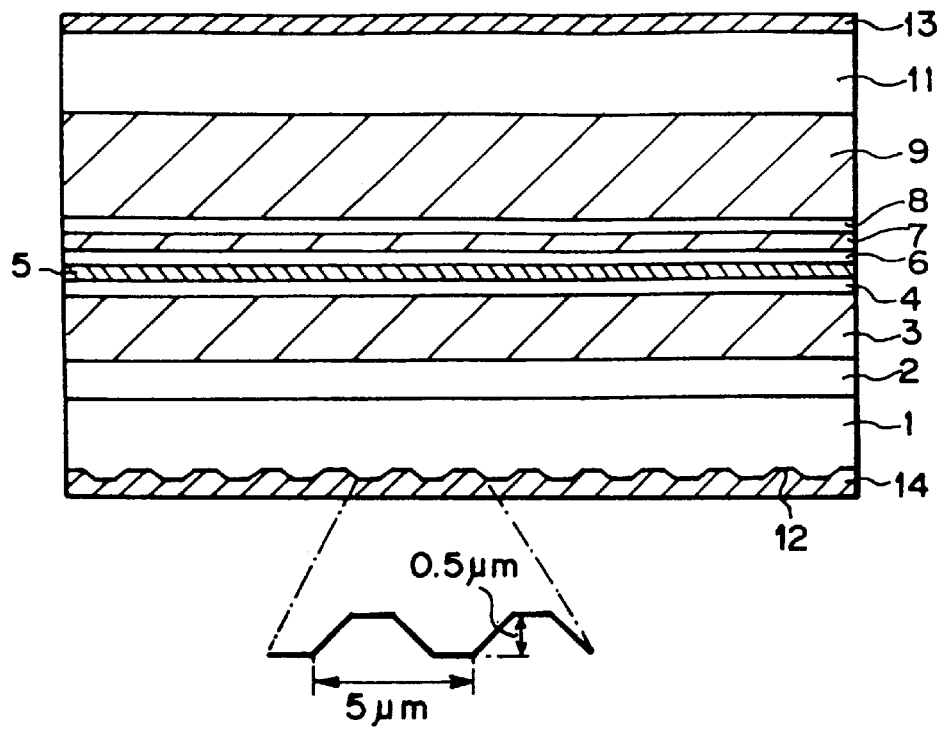
FIG. 3 is a cross-sectional view taken along line III—III in FIG. 1.
Figure 4:
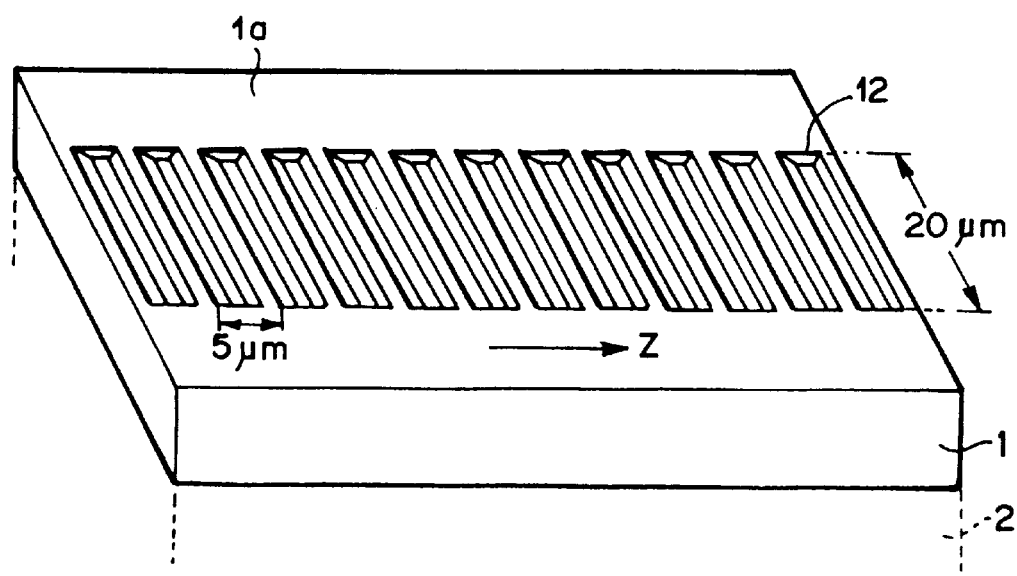
FIG. 4 is a view showing the pattern of concavity and convexity formed on the lower surface of the substrate of the semiconductor laser shown in FIG. 1, FIGS. 5A to 5D are views showing other examples of the pattern of concavity and convexity.

A 0.98 μm band semiconductor laser in accordance with a first embodiment of the present invention will be described with reference to FIGS. 1 to 4, hereinbelow.

The semiconductor laser of this embodiment is of a general waveguide structure and is characterized in that a plurality of grooves 12 are formed on a substrate 1 to extend in a direction perpendicular to the direction of waveguide. The grooves 12 are formed at a pitch of 5 μm in the direction of waveguide.

The structure of the semiconductor laser will be described in conjunction with the procedure of forming the semiconductor laser, hereinbelow.

An n-GaAs buffer layer 2 (0.5 μm thick, doped with $1 \times 10^{18}$ cm$^{-3}$ of Si), an n-InGaAsP clad layer 3 (composition-depending wavelength=670 nm, 2.5 μm thick, doped with $1 \times 10^{18}$ cm$^{-3}$ of Si), an InGaAsP light guide layer 4 (undoped, 0.05 μm thick), an InGaAs quantum-well layer 5 (undoped, 7 nm thick), an InGaAsP optical light guide layer 6 (undoped, 0.05 μm thick), a p-InGaP clad layer 7 (0.1 μm thick, doped with $1 \times 10^{18}$ cm$^{-3}$ of Zn), a p-GaAs etching stop layer 8 (5 nm thick, doped with $1 \times 10^{18}$ cm$^{-3}$ of Zn), and a p-InGaP clad layer 9 (1.2 μm thick, doped with $1 \times 10^{18}$ cm$^{-3}$ of Zn) are first grown in this order on an n-GaAs substrate 1 (doped with $1 \times 10^{18}$ cm$^{-3}$ of Si) by vacuum MOCVD method.

Then a film 12 of SiO$_2$ is formed on the p-InGaP clad layer 9 by plasma CVD. Then the SiO$_2$ film 12 is shaped into a stripe by photolithography. Then the p-InGaP clad layer 9 is selectively etched up to the p-GaAs etching stop layer 8 using the SiO$_2$ film stripe 12 as a mask, thereby forming an inverted mesa-shaped stripe (about 3 μm wide in the upper side and about 2 μm wide in the lower side).

Then an n-InGaAlP current stopping layer 10 (about 1 μm thick, doped with $8 \times 10^{17}$ cm$^{-3}$ of Si) is grown by vacuum MOCVD method using the SiO$_2$ film stripe 12 as a mask and the SiO$_2$ film stripe 12 is removed. Then a p-GaAs cap layer 11 is grown over the entire area and the top surface of the p-GaAs cap layer 11 is flattened. Thereafter the lower surface of the n-GaAs substrate 1 is ground and etched, thereby thinning the substrate 1 to about 100 μm. A plurality of parallel grooves 12 (FIG. 4) are formed on the lower surface 1a of the substrate 1 by photolithography and etching. Each groove 12 extends by about 20 μm in a direction perpendicular to the direction Z of waveguide and is about 0.5 μm in depth. The grooves 12 are formed at a pitch of 5 μm in the direction Z of waveguide. The grooves 12 are formed on the lower surface 1aa of the substrate 1 in a region corresponding to the stripe of the clad layer 9 which forms the oscillating part of the semiconductor laser. Finally a p-side electrode 13 and an n-side electrode 14 are formed.

In this particular embodiment, the buffer layer 2, the clad layer 3 and the light guide layer 4 form a first semiconductor layer 20, and the light guide layer 6, the clad layer 7, the etching stop layer 8, the clad layer 9, the current stopping layer 10 and the cap layer 11 form a second semiconductor layer 21.

The composition of the InGaAs active layer should be selected so that the oscillation wavelength is in the range of 0.9 μm to 1.1 μm to which GaAs is transparent.

In the semiconductor laser of this particular embodiment, the first and second semiconductor layers 20 and 21 and the substrate 1 between the electrodes 13 and 14 are all transparent to the oscillation wavelength, 0.98 μm. However the grooves 12 on the substrate 1 scatter light and suppress interference of light. Thus this semiconductor laser can oscillate stably in a single mode.

Figure 5A:
Figure 5B:
Figure 5C:
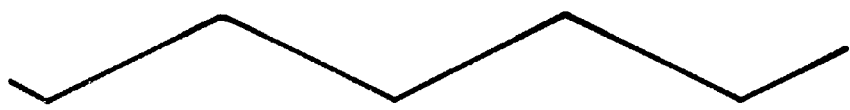
Figure 5D:
Figure 6:
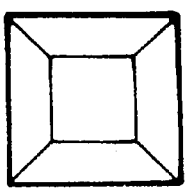
FIG. 6 is a view showing a still another example of the pattern of concavity and convexity.
Figure 6:
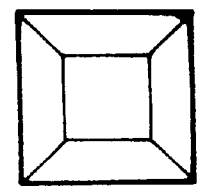
Figure 6:
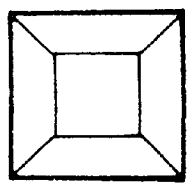
Figure 6:
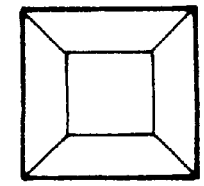

Though in the first embodiment, the pattern of concavity and convexity are in the form of grooves 12 which are formed on the substrate 1 at regular intervals and are as shown in FIG. 5A in cross-sectional shape, the grooves 12 may be various in cross-sectional shape including those shown in FIGS. 5B to 5D. Such grooves may be formed by normal photolithography using a mask or by interference exposure. In the case of grooves arranged in a stripe pattern, it is most preferred that the grooves extend in a direction perpendicular to the longitudinal direction of the stripe of the p-InGaP clad layer 9, i.e., the direction Z of waveguide. However a certain effect can be obtained even if the grooves extend in other direction. FIG. 6 shows another example of the pattern of concavity and convexity as seen in the direction of arrow A in FIG. 2. That is, the pattern of concavity and convexity may be in the form of local projections or recesses such as islands, holes or the like.

The pattern of concavity and convexity may be formed in any portion including a region corresponding to the stripe of the p-InGaP clad layer 9, it is practically preferred that the pattern of concavity and convexity does not occupy a so large area when a heat sink is brazed to the semiconductor laser not to interfere with wire bonding. By forming the pattern of concavity and convexity on the lower surface of the substrate, multiple interference which is caused in the conventional semiconductor laser by light of the oscillation wavelength reflected by the n-side electrode can be suppressed, whereby a single line oscillation spectrum can be stably obtained.

Though in the embodiment described above, the pattern of concavity and convexity is formed on the lower surface of the substrate, it may be formed on the upper surface of the cap layer which is the upper surface of the epitaxial layer of the semiconductor layer. In this case, multiple interference which is caused in the conventional semiconductor laser by light of the oscillation wavelength reflected by the p-side electrode can be suppressed.

Figure 7:
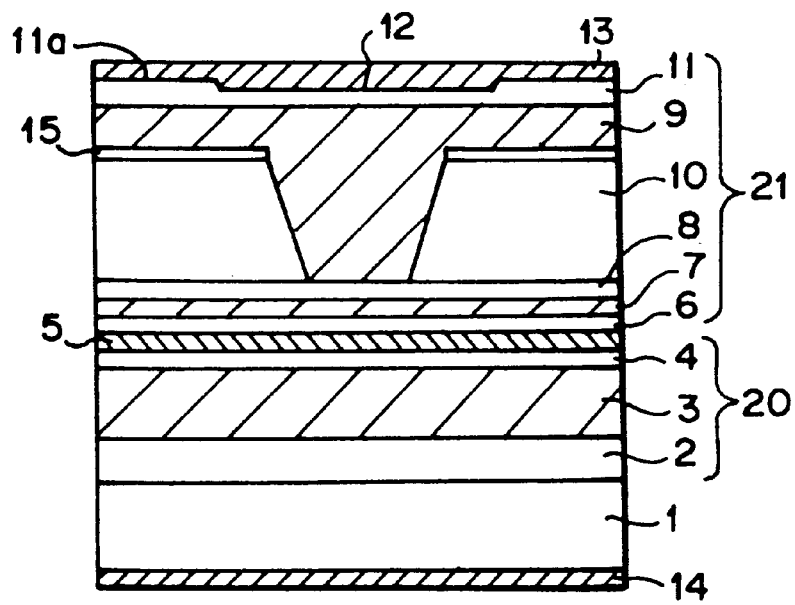
FIG. 7 is a cross-sectional view showing a modification of the semiconductor laser shown in FIG. 1.
Figure 8:
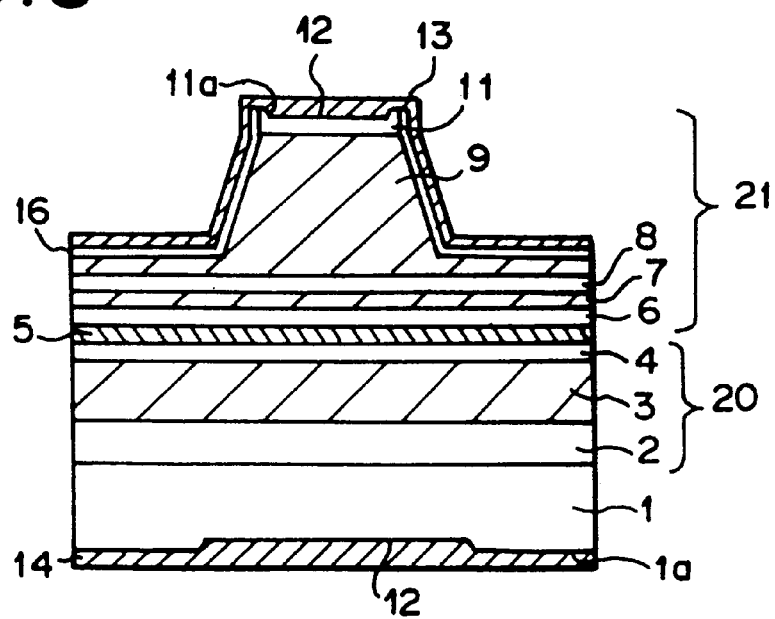
FIG. 8 is a cross-sectional view showing another modification of the semiconductor laser shown in FIG. 1.

The waveguide structure for stabilizing the transverse mode need not be limited to that employed in the first embodiment. For example, the semiconductor laser may be one in which the clad layer 9 extends over the current stopping layer 10 with an oxidization stopping layer 15 intervening therebetween as shown in FIG. 7 or may be of a ridge stripe structure in which an insulating layer 16 is formed on the ridge-like clad layer 9 except the upper surface of the ridge as shown in FIG. 8. Further the materials and the arrangement of the layers need not be limited to those employed in the first embodiment but AlGaAs and/or InGaAlP may be employed as the materials for the clad layers and the light guide layers. The grooves 12 (the pattern of concavity and convexity) may be formed on the upper surface 11a of the cap layer 11 (the upper surface of the epitaxial layer) in a region corresponding to the stripe of the p-InGaP clad layer 9 as shown in FIG. 7. Further the grooves 12 (the pattern of concavity and convexity) may be formed on both the lower surface 1a of the substrate 1 and the upper surface 11a of the cap layer 11 as shown in FIG. 8.

Figure 9:
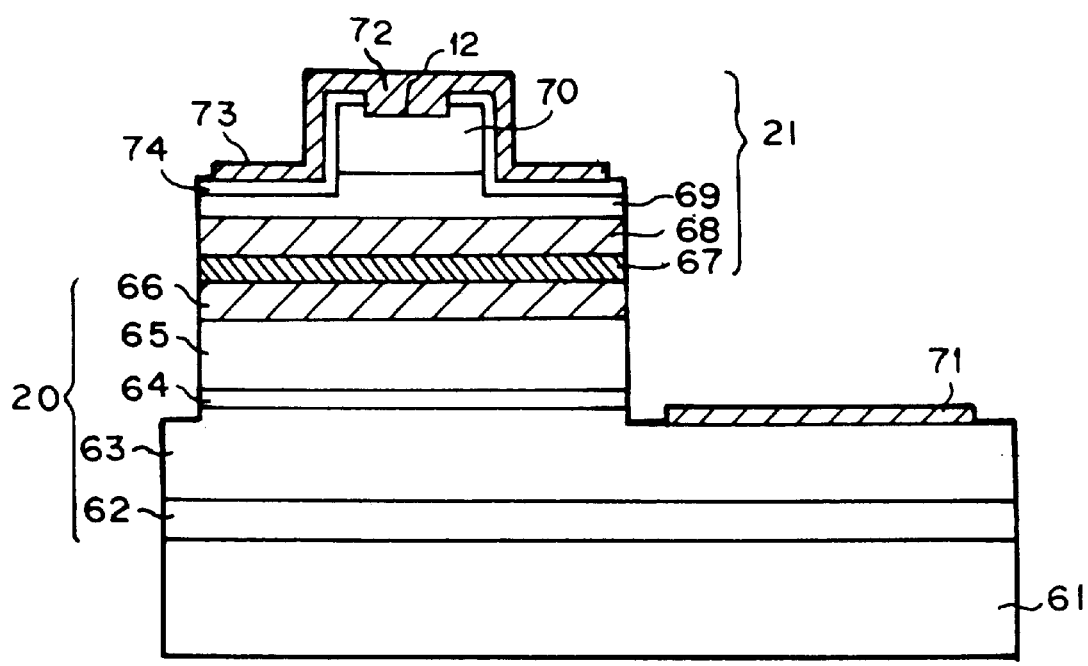
FIG. 9 is a cross-sectional view of a semiconductor laser having an InGaN active layer in accordance with a second embodiment of the present invention.
Figure 10A:
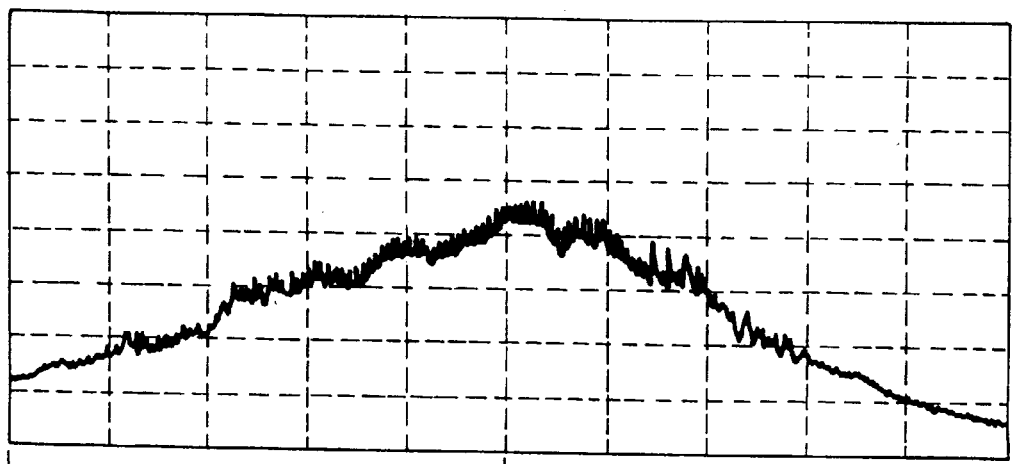
FIG. 10A is a graph showing the emission spectrum of a conventional refractive index waveguide type single transverse mode semiconductor laser in a state below the threshold condition.
Figure 10B:
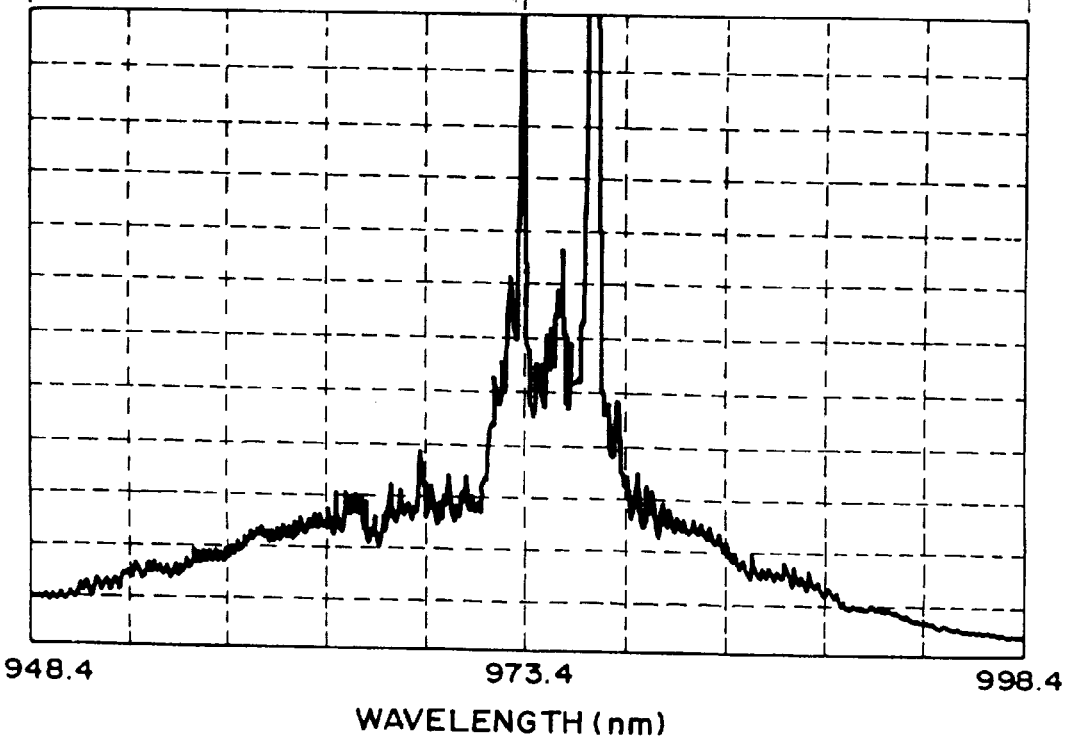
FIG. 10B is a graph showing the emission spectrum of the semiconductor laser in a lasing state.
Figure 11:
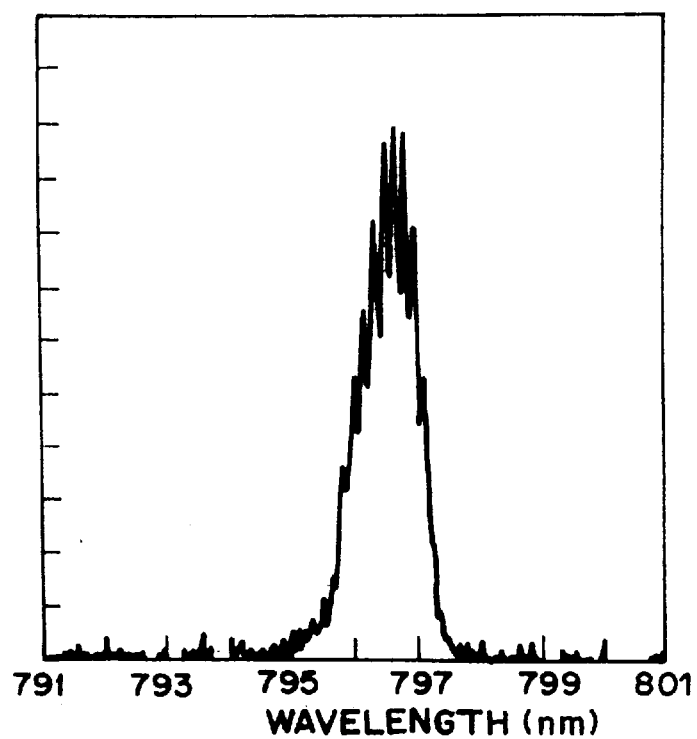
FIG. 11 is a graph showing an oscillation spectrum of a conventional gain optical waveguide type multiple transverse mode laser which has a stripe 50 μm wide and oscillates near 800 nm.
Figure 12:
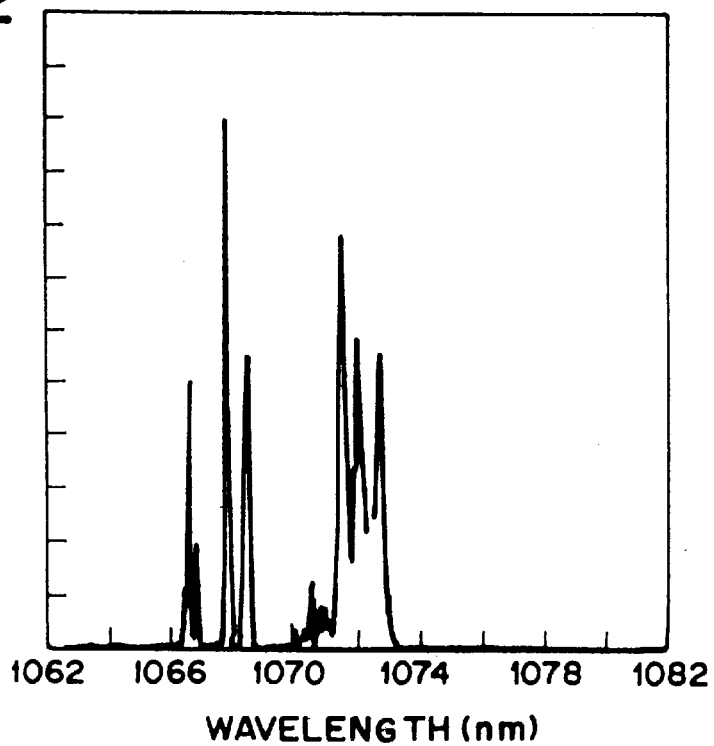
FIG. 12 is a graph showing an oscillation spectrum of a conventional gain optical waveguide type multiple transverse mode laser which has a stripe 50 μm wide and oscillates near 1070 nm.

A 0.41 $\mu$m band semiconductor laser having an active layer of InGaN in accordance with a second embodiment of the present invention will be described with reference to FIG. 9, hereinbelow.

The structure of the semiconductor laser of the second embodiment will be described in conjunction with the procedure of forming the semiconductor laser, hereinbelow.

An n-GaN low temperature buffer layer 62, an n-GaN buffer layer 63 (5 $\mu$m thick, doped with Si), an n-$In_{0.05}Ga_{0.95}N$ buffer layer 64 (0.1 $\mu$m thick, doped with Si), an n-$Al_{0.07}Ga_{0.93}N$ clad layer 65 (0.1 $\mu$m thick, doped with Si), an n-GaN light guide layer 66 (0.1 $\mu$m thick, doped with Si), an undoped active layer 67, a p-GaN optical light guide layer 68 (0.1 $\mu$m thick, doped with Mg), a p-$Al_{0.07}Ga_{0.93}N$ clad layer 69 (0.5 $\mu$m thick, doped with Mg), and p-GaN cap layer 70 (0.3 $\mu$m thick, doped with Mg) are first grown in this order on a substrate 61 of a sapphire c-face by MOCVD method. The active layer 67 is of a multiquantum-well structure comprising three layers of undoped InGaN quantum-well layers (5 nm thick) and two layers of undoped InGaN barrier layers (10 nm thick) and terminated by an undoped AlGaN barrier layer (0.02 $\mu$m thick) as a layer for stopping evaporation of In.

Then p-type impurities are activated by heat treatment in a nitrogen gas atmosphere. Thereafter grooves 12 are formed on the p-GaN cap layer 70 at a pitch of 0.4$\mu$m in a depth of about 0.1 $\mu$m by interference exposure and reactive ion beam etching using chlorine ions. Further a ridge stripe is formed by removing the epitaxial layer from the cap layer 70 to a part of the clad layer 69 at a distance of 0.1 $\mu$m from the light guide layer 68 by photolithography and reactive ion beam etching using chlorine ions with a ridge portion about 3.5 $\mu$m wide left there. The end faces of the resonator are formed by etching.

Then a SiN film 74 is formed over the entire surface by plasma CVD and the epitaxial layer except the ridge portion is removed to such an extent that the n-GaN buffer layer 63 is exposed by photolithography and reactive ion beam etching with Cl ions in order to form a p-side electrode. Then a current injection window 72 in the form of a stripe is formed on the ridge portion by photolithography and etching. Thereafter the lower surface of the sapphire substrate 61 is ground to thin the substrate 61 to about 100 $\mu$m.

Thereafter a Ti/Al/Ti/Au electrode and a Ni/Au electrode are formed by vacuum deposition respectively over the current injection window 72 and the exposed part of the buffer layer 63 as a p-side electrode 73 and an n-side electrode 71 and annealed in nitrogen gas atmosphere, thereby forming ohmic electrodes.

In this particular embodiment, the buffer layers 62, 63 and 64, the clad layer 65 and the light guide layer 66 form a first semiconductor layer 20, and the light guide layer 68, the clad layer 69 and the cap layer 70 form a second semiconductor layer 21.

Also in the semiconductor laser of this embodiment, the first and second semiconductor layers 20 and 21 and the substrate 61 are all transparent to the oscillation wavelength.

However the grooves 12 on the upper surface of the cap layer 70 scatters light and suppresses interference of light due to light of the oscillation wavelength reflected at the surface of the p-side electrode. Thus this semiconductor laser can oscillate stably in a single longitudinal mode without modulation of the spectrum at a long period.

Though, in the second embodiment, a c-face of sapphire, which is an insulating material, is employed as the substrate, the substrate may be of various materials such as an a-face of sapphire, spinel, SiC, which is conductive, and the like. Further the semiconductor laser may be of various structures including a gain waveguide type other than that described above. The end faces of the resonator may be formed by various methods without limited to etching. For instance, the end faces of the resonator may be formed by use of cleavage.

What is claimed is:

1. An end face emitting type semiconductor laser comprising:

a substrate;

a first semiconductor layer, which includes a first clad layer, formed on the substrate;

an active layer formed on the first semiconductor layer;

a second semiconductor layer, which includes a second clad layer and a cap layer, formed on the active layer, wherein the cap layer is formed above the second clad layer;

a first electrode formed on the substrate or the first semiconductor layer; and a second electrode formed on the upper surface of the second semiconductor layer such that the cap layer is adjacent to the second electrode, wherein the second semiconductor layer is transparent to light of a wavelength at which the semiconductor laser oscillates, and further wherein a pattern of concavity and convexity is formed on the upper surface of the cap layer in a region corresponding to an oscillating part of the semiconductor laser.

2. An end face emitting type semiconductor laser as defined in claim 1 in which the substrate is of GaAs and the active layer is of InGaAs.

3. An end face emitting type semiconductor laser as defined in claim 1 in which the active layer is of InGaN.

4. An end face emitting type semiconductor laser comprising:

a substrate;

a first semiconductor layer, which includes a first clad layer, formed on the substrate;

an active layer formed on the first semiconductor layer;

a second semiconductor layer, which includes a second clad layer, formed on the active layer;

a first electrode formed on the lower surface of the substrate; and a second electrode formed on the upper surface of the second semiconductor layer, wherein the first semiconductor layer and the substrate are transparent to light of a wavelength at which the semiconductor laser oscillates, and further wherein a pattern of concavity and convexity is formed on the lower surface of the substrate in a region corresponding to an oscillating part of the semiconductor laser.

5. An end face emitting type semiconductor laser as defined in claim 4 in which the substrate is of GaAs and the active layer is of InGaAs.

6. An end face emitting type semiconductor laser as defined in claim 4 in which the active layer is of InGaN.

7. An end face emitting type semiconductor laser comprising:

substrate;

a first semiconductor layer, which includes a first clad layer formed on the substrate;

an active layer formed on the first semiconductor layer;

a second semiconductor layer, which includes a second clad layer and a cap layer, formed on the active layer, wherein the cap layer is formed above the second clad layer;

a first electrode formed on the lower surface of the substrate; and a second electrode formed on the upper surface of the second semiconductor layer such that the cap layer is adjacent to the second electrode, wherein the first semiconductor layer, the substrate and the second semiconductor layer are transparent to light of a wavelength at which the semiconductor laser oscillates, and further wherein a pattern of concavity and convexity is formed on at least one of the upper surface of the cap layer and the lower surface of the substrate in a region corresponding to an oscillating part of the semiconductor laser.

8. An end face emitting type semiconductor laser as defined in claim 7 in which the substrate is of GaAs and the active layer is of InGaAs.

9. An end face emitting type semiconductor laser as defined in claim 7 in which the active layer is of InGaN.

* * * * *